(12) United States Patent
Yamazaki et al.

(10) Patent No.: US 10,115,792 B2
(45) Date of Patent: Oct. 30, 2018

(54) SEMICONDUCTOR DEVICE AND METHOD OF MANUFACTURING SEMICONDUCTOR DEVICE

(71) Applicant: ROHM CO., LTD., Kyoto (JP)

(72) Inventors: Shinya Yamazaki, Kyoto (JP); Ryotaro Yagi, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/041,012

(22) Filed: Feb. 10, 2016

(65) Prior Publication Data

US 2016/0163795 A1 Jun. 9, 2016

Related U.S. Application Data

(63) Continuation of application No. 14/253,313, filed on Apr. 15, 2014, now Pat. No. 9,281,391.

(30) Foreign Application Priority Data

Apr. 16, 2013 (JP) .................................. 2013-085787

(51) Int. Cl.

| H01L 29/06 | (2006.01) |
|---|---|
| H01L 29/78 | (2006.01) |
| H01L 27/06 | (2006.01) |
| H01L 49/02 | (2006.01) |
| H01L 29/66 | (2006.01) |

(52) U.S. Cl.
CPC ...... *H01L 29/0653* (2013.01); *H01L 27/0629* (2013.01); *H01L 28/60* (2013.01); *H01L 29/78* (2013.01); *H01L 29/66575* (2013.01)

(58) Field of Classification Search
CPC . H01L 29/0653; H01L 29/78; H01L 27/0629; H01L 28/60
See application file for complete search history.

(56) References Cited

U.S. PATENT DOCUMENTS 5,357,131 A * 10/1994 Sunami ............... H01L 21/0337
257/301
5,438,023 A * 8/1995 Argos, Jr. ............. H01L 23/291
257/E23.118
(Continued)

FOREIGN PATENT DOCUMENTS

| JP | 2007-96310 A | 4/2007 |
|---|---|---|
| JP | 2008-108875 A | 5/2008 |

(Continued)

*Primary Examiner* — Long Pham
(74) *Attorney, Agent, or Firm* — Rabin & Berdo, P.C.

(57) ABSTRACT

A semiconductor device is disclosed. The semiconductor device includes an insulating layer formed selectively on a semiconductor layer; a lower electrode, formed on the insulating layer, having an end portion at a position spaced apart by a predetermined distance inward from a periphery of the insulating layer; a dielectric film formed on the lower electrode; an upper electrode, formed on the dielectric film, facing the lower electrode with the dielectric film interposed between the upper electrode and the lower electrode; and a passivation film, formed to cover the insulating layer, starting from the end portion of the lower electrode and extending toward the periphery of the insulating layer. The passivation film includes an insulating material having an etching selectivity with respect to the insulating layer.

13 Claims, 14 Drawing Sheets

(56) References Cited

U.S. PATENT DOCUMENTS

2012/0097967 A1* 4/2012 Choi .................. H01L 27/3262
257/72
2014/0159201 A1 6/2014 Keller et al.
2014/0291479 A1* 10/2014 Lu .................. H01L 31/035218
250/200

FOREIGN PATENT DOCUMENTS

JP 2010-267804 A 11/2010
JP 2012-19011 A 1/2012

* cited by examiner

SEMICONDUCTOR DEVICE AND METHOD OF MANUFACTURING SEMICONDUCTOR DEVICE

CROSS-REFERENCE TO RELATED APPLICATION(S)

This is a continuation of U.S. application Ser. No. 14/253,313, filed Apr. 15, 2014. Furthermore, this application claims the benefit of foreign priority of Japanese application number 2013-85787, filed on Apr. 16, 2013. The disclosures of these earlier applications are incorporated herein by reference in their entirety.

TECHNICAL FIELD

The present disclosure relates to a semiconductor device including a capacitor formed on an insulating layer and a method of manufacturing such a semiconductor device.

BACKGROUND

There has been proposed a semiconductor device including a field oxide film formed by a LOCOS (LOCal Oxidation of Silicon) method which identifies an active region, and a capacitor formed on a particular portion of the field oxide film. More specifically, the semiconductor device is configured to have a capacitive film interposed between a lower electrode and an upper electrode.

For example, in a conventional method for manufacturing such a semiconductor device, a lower electrode and a capacitive film are formed on a thermal oxide film. When a portion of the thermal oxide film (e.g., a pad oxide film) covering an active region of the semiconductor device is removed using wet etching, an etchant may be spread on the field oxide film that may result in small cavities being formed due to side-etching a surface of the field oxide film.

When an electrode material for an upper electrode is deposited in a later process, the electrode material may be introduced into the cavities, and may remain as an etching residue after performing the process for forming the upper electrode. In this case, a problem may occur if the etching residue is dislodged from the cavity in subsequent etching or cleaning processes, and is attached as undesirable particles to the semiconductor substrate.

There is a need to curb such particles since they may cause a short circuit effect in the active region or a malfunction of the semiconductor device.

SUMMARY

The present disclosure provides various embodiments of a semiconductor device with high reliability which is manufactured with reduced or no particles resulting from an etching residue when forming a capacitor on an insulating layer, and a method of manufacturing such a semiconductor device.

According to one embodiment of the present disclosure, there is provided a semiconductor device including: an insulating layer formed selectively on a semiconductor layer; a lower electrode, formed on the insulating layer, having an end portion at a position spaced apart by a predetermined distance inward from a periphery of the insulating layer; a dielectric film formed on the lower electrode; an upper electrode, formed on the dielectric film, facing the lower electrode with the dielectric film interposed between the upper electrode and the lower electrode; and a passivation film, formed to cover the insulating layer, starting from the end portion of the lower electrode and extending toward the periphery of the insulating layer, the passivation film including an insulating material having an etching selectivity with respect to the insulating layer.

In the above configurations, the passivation film having the etching selectivity different from that of the insulating layer is formed to cover the insulating layer, beginning from the end portion of the lower electrode and extending toward the periphery of the insulating layer. Thus, in the manufacturing process, although an insulating film (i.e., the dielectric layer) including the same material as the insulating layer is wet-etched, the passivation film can prevent the insulating layer from being exposed to an etchant. Therefore, it is possible to prevent a surface of the insulating layer from being side-etched, thereby curbing the formation of any undesirable cavities.

As a result of curbing the formation of cavities, build-up of particles due to etching residue introduced in such cavities can be prevented, and thus, it is possible to manufacture a semiconductor device with high reliability.

In one embodiment, the insulating layer may be an element isolation insulating layer that defines an active region (e.g., a boundary of the active region) in the semiconductor layer.

In one embodiment, the passivation film may be formed to start from the end portion of the lower electrode and extend toward the active region.

Thus, the element isolation insulating layer may be prevented from being side-etched, the element isolation insulating layer being directly below the end portion of the lower electrode in which cavities could have otherwise been formed from the side-etching. As a result, it is possible to curb etching residue from forming, and in turn, prevent particles that could have been produced in a region directly below the end portion of the lower electrode from forming.

In one embodiment, the passivation film may be formed to reach a boundary between the element isolation insulating layer and the active region.

Thus, an entire surface of the element isolation insulating layer may be prevented from being side-etched. As a result, it is possible to better curb the formation of particles resulting from etching residue on the surface of the element isolation insulating layer.

In one embodiment, the dielectric film may extend through a corner portion between an upper surface and a side surface of the lower electrode to be formed on the side surface of the lower electrode, and may be integrated with the passivation film at the end portion of the lower electrode.

With this configuration, since the surface of the lower electrode is covered by the passivation film having an insulating material, it is possible to protect the lower electrode from a short-circuit.

In one embodiment, the upper electrode may be formed to face an entire upper surface of the lower electrode.

With this configuration, since the upper electrode can be formed to face the entire upper surface of the lower electrode, it is possible to increase a capacitance of a capacitor.

In one embodiment, the insulating layer may include an $SiO_2$ layer, and the passivation film may include an $Si_3N_4$ film or an ONO film.

In one embodiment, the insulating layer may include a LOCOS oxide film. Further, in one embodiment, the insulating layer may include an insulating film buried in a shallow trench formed in the semiconductor layer.

According to another embodiment of the present disclosure, there is provided a method of manufacturing a semiconductor device, including: forming, on a semiconductor layer, an insulating layer in which a sacrifice region to be selectively removed and a protection region are set; forming a lower electrode in the protection region, the lower electrode having an end portion at a position spaced apart by a predetermined distance inward from a periphery of the protection region; forming a dielectric film on the lower electrode; forming a passivation film to selectively cover a region between the end portion of the lower electrode and the periphery of the protective region, the passivation film including an insulating material which has an etching selectivity with respect to the insulating layer; removing the sacrifice region by isotropic etching under a state where the protection region is covered by the passivation film; and after removing the sacrifice region, depositing an electrode material to cover a surface of the semiconductor layer and selectively removing a portion of the electrode material such that a portion of the electrode material located on the dielectric film is left as an upper electrode.

With the above embodiment, when the sacrifice region of the insulating layer is etched, the protection region is covered with the passivation film, and thus, the passivation film can prevent the protective region from being exposed to an etchant. Accordingly, it is possible to prevent a surface of the protection region from being side-etched, thereby preventing any undesired cavities.

As a result of preventing undesired cavities from forming, build-up of particles due to etching residue introduced in such cavities can be prevented, and thus, it is possible to manufacture a semiconductor device with high reliability.

In one embodiment, the act of forming the insulating layer may include forming a pad insulating film as the sacrifice region in an active region of the semiconductor layer and forming an element isolation insulating layer as the protection region in a region other than the active region.

In one embodiment, the act of forming the passivation film may include forming the passivation film beginning from the end portion of the lower electrode and extend toward the active region.

Thus, the element isolation insulating layer directly below the end portion of the lower electrode, in which a cavity would have been likely to be formed by side-etching, may be prevented from being side-etched. As a result, it is possible to curb etching residue from forming, and in turn, prevent particles that could have been produced in a region directly below the end portion of the lower electrode from forming.

In one embodiment, the act of forming the passivation film may include forming the passivation film as an extension of the dielectric film that starts from a corner portion between an upper surface and a side surface of the lower electrode and covers the side surface of the lower electrode and the protection region.

In this configuration, since the passivation film and the dielectric film can be simultaneously formed, it is possible to simplify the manufacturing process. In addition, in the manufactured semiconductor device, since the surface of the lower electrode can be covered by the passivation film, which includes an insulating material, it is possible to protect the lower electrode from a short-circuit.

In one embodiment, the act of forming the upper electrode may include forming the upper electrode to face an entire upper surface of the lower electrode.

With this configuration, since the upper electrode can be formed to face the entire upper portion of the lower electrode, it is possible to increase a capacitance of a capacitor.

In one embodiment, the act of forming the passivation film may include forming the passivation film to cover the entire protection region before forming the lower electrode, and the act of forming the lower electrode may include forming the lower electrode to face the protection region while the passivation film is interposed between the lower electrode and the protection region.

With this configuration, although the passivation film is formed in an early phase to cover the entire protection region, it is possible to prevent side-etching in a region directly below the termination of the lower electrode. In addition, since the passivation film which extends across the end portion of the lower electrode is formed along the surface of the protection region, a step coverage (i.e., coating effect) of the end portion of the lower electrode can be improved.

In one embodiment, the act of forming the passivation film may include forming the passivation film to reach a boundary between the element isolation insulating layer and the active region.

With this configuration, side-etching in the entire surface of the element isolation insulating layer can be prevented. Accordingly, a step between the surface of the element isolation insulating layer and the upper surface of the dielectric film can be reduced. As a result, since it is possible to reduce a step between portions of the electrode material layer for the upper electrode on the dielectric film (i.e., a portion to become the upper electrode) and on the element isolation insulating layer (i.e., a portion to be removed), it is possible to shorten etching time required to remove the portion to be removed.

In one embodiment, the act of removing the sacrifice region may include etching the passivation film using an etching mask.

With this configuration, since the sacrifice region can be removed without forming a new etching mask, it is possible to simplify the manufacturing process.

In one embodiment, the insulating layer may include an $SiO_2$ layer, and the passivation film may include an $Si_3N_4$ film or an ONO film.

Further, in one embodiment, the act of forming the insulating layer may include forming a pad oxide film on an entire surface of the semiconductor layer and forming a LOCOS oxide film as the element isolation insulating layer to be integrated with the pad oxide film by selectively subjecting a region of the semiconductor layer other than the active region to thermal oxidation.

DETAILED DESCRIPTION

Exemplary embodiments of the present disclosure will now be described in detail with reference to the drawings.

Figure 1:
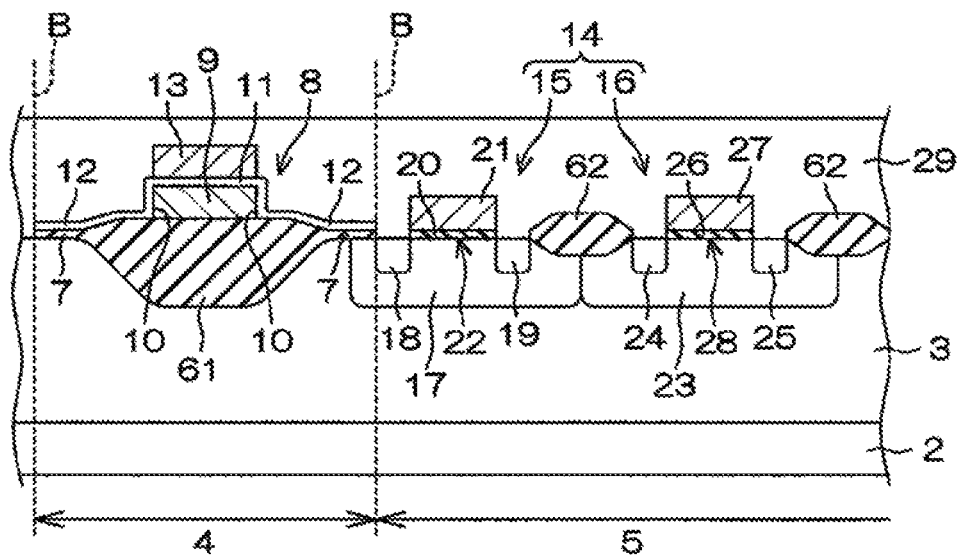
FIG. 1 schematically illustrates a sectional view of a semiconductor device according to a first embodiment of the present disclosure.

FIG. 1 schematically illustrates a sectional view of a semiconductor device 1 according to a first embodiment of the present disclosure. The semiconductor device 1 includes an n$^+$-type semiconductor substrate 2 and an n$^-$-type epitaxial layer 3 formed on the semiconductor substrate 2. An impurity concentration of the semiconductor substrate 2 may range, for example, from $1.0 \times 10^{17}$ cm$^{-3}$ to $1.0 \times 10^{20}$ cm$^{-3}$ and an impurity concentration of the epitaxial layer 3 may range, for example, from $1.0 \times 10^{14}$ cm$^3$ to $1.0 \times 10^{16}$ cm$^{-3}$. Examples of the n-type impurity may include P (phosphorus), As (arsenic), and the like. In this embodiment, the stacked structure of the semiconductor substrate 2 and the epitaxial layer 3 is shown as an example of a semiconductor layer in the present disclosure.

As an example of an insulating layer for partitioning an element isolation region 4 and an active region 5, a first element isolation insulating layer 61 is selectively formed on a surface of the epitaxial layer 3. For example, the first element isolation insulating layer 61 may be a LOCOS (LOCal Oxidation of Silicon) oxide layer formed by selectively oxidizing the surface of the epitaxial layer 3. As such, the first element isolation insulating layer 61 may include SiO$_2$ as a main material.

The first element isolation insulating layer 61 includes raised portions 7 formed to overlap the surface of the epitaxial layer 3 at a peripheral portion of the first element isolation insulating layer 61. The raised portions 7 include the same insulating material as the first element isolation insulating layer 61 and is formed to be connected integrally with the first element isolation insulating layer 61.

The raised portions 7 have sectional surfaces that are substantially vertical to the surface of the epitaxial layer 3, and a thickness of the sectional surfaces that ranges, for example, from 0.2 μm to 1.0 μm. A boundary B between the element isolation region 4 and the active region 5 is set by the sectional surface of the raised portion 7. In addition, the boundary B may be determined at random in a process of manufacturing the semiconductor device 1, as will be described below. A capacitor 8 is formed on the first element isolation insulating layer 61.

The capacitor 8 includes a lower electrode 9 having a pair of end portions 10 at opposite side surfaces of the lower electrode 9. Each of the end portions 10 is positioned to be spaced apart by a predetermined distance inward from a periphery of the first element isolation insulating layer 61 (i.e., the boundary B). The capacitor 8 also includes a dielectric film 11 formed on the lower electrode 9, a passivation film 12 formed to cover a region between the end portion 10 of the lower electrode 9 (at a lower portion of the side surface of the lower electrode 9) and the boundary B, and an upper electrode 13 formed on the dielectric film 11 to face the lower electrode 9 with the dielectric film 11 interposed between the upper electrode 13 and the lower electrode 9. For example, the lower electrode 9 may include a polysilicon-containing electrode material.

The dielectric film 11 may be formed on the side surface of the lower electrode 9 by extending through a corner portion between an upper surface and the side surface of the lower electrode 9 so as to cover the lower electrode 9. A thickness of the dielectric film 11 may range, for example, from 0.01 μm to 0.05 μm. In some embodiments, the dielectric film 11 may include an Si$_3$N$_4$ film or an ONO film (Oxide-Nitride-Oxide film) including a pair of SiO$_2$ films and an Si$_3$N$_4$ film interposed therebetween.

The passivation film 12 is formed to be connected integrally with the dielectric film 11 at the end portion 10 of the lower electrode 9. The passivation film 12 has the same thickness as the dielectric film 11 and includes the same material as the dielectric film 11. Further, the passivation film 12 is formed to start from the end portion of the lower electrode 9 and extend midway between the lower electrode 9 and the first element isolation insulating layer 61. In this case, an end portion of the passivation film 12 may be formed to reach the boundary B between the element isolation region 4 and the active region 5. A sectional surface of the end portion of the passivation film 12 is formed to be substantially flush with the sectional surface of the raised portion 7 of the first element isolation insulating layer 61.

The upper electrode 13 is formed to face an entire upper surface of the lower electrode 9. Specifically, in this embodiment, a side surface of the upper electrode 13 is formed to be substantially flush with the side surface of the lower electrode 9. For example, the upper electrode 13 may include a polysilicon or tungsten silicon-containing electrode material. In the manner as described above, the capacitor 8 is formed on the first element isolation insulating layer 61.

In some embodiments, an end portion of the upper electrode 13 may extend outward from the side surface of the lower electrode 9 such that the side surface of the upper electrode 13 is positioned outward from the side surface of the lower electrode 9 or may retract inward from the side surface of the lower electrode 9 such that the side surface of the upper electrode 13 is positioned inward from the side surface of the lower electrode 9.

As an example of a semiconductor element, a CMOS (Complementary Metal-Oxide Semiconductor) 14 may be formed in the active region 5. The CMOS 14 includes an n-MOS (Metal-Oxide Semiconductor) region 15 of an n-type and a p-MOS region 16 of a p-type, which are isolated from each other by a second element isolation insulating layer 62. For example, the second element isolation insulating layer 62 may be a LOCOS oxide film formed by selectively oxidizing the surface of the epitaxial layer 3 and may be formed to be smaller than the first element isolation insulating layer 61. Like the first element isolation insulating layer 61, the second element isolation insulating layer 62 may include $SiO_2$ as a main material.

A p-type well region 17 is formed in the surface of the epitaxial layer 3 within the n-MOS region 15. A side surface of the p-type well region 17 (located at a side of the element isolation region 4) is formed in a thickness direction of the epitaxial layer 3 from a bottom surface of the raised portion 7 (located at a side of the active region 5) of the first element isolation insulating layer 61. A side surface of the p-type well region 17 (located at an opposite side of the element isolation region 4) is formed in the thickness direction of the epitaxial layer 3 from a bottom surface of the second element isolation insulating layer 62.

An $n^+$-type source region 18 and an $n^+$-type drain region 19 are formed selectively in an inner region of the p-type well region 17 to be spaced apart from each other. An n-MOS gate electrode 21 is formed on the surface of the epitaxial layer 3 within the n-MOS region 15 while an n-MOS gate oxide film 20 is interposed between the n-MOS gate electrode 21 and the epitaxial layer 3.

An impurity concentration of the p-type well region 17 may range, for example, from $1.0 \times 10^{15}$ cm$^{-3}$ to $1.0 \times 10^{17}$ cm$^{-3}$, and an impurity concentration of the $n^+$-type source region 18 and the $n^+$-type drain region 19 may range, for example, from $1.0 \times 10^{18}$ cm$^{-3}$ to $1.0 \times 10^{20}$ cm$^3$. An example of the p-type impurity may include B (boron), Mg (magnesium), or the like.

A region between the $n^+$-type source region 18 and the $n^+$-type drain region 19 corresponds to an n-MOS channel region 22 of the n-MOS region 15. The n-MOS gate electrode 21 controls forming a channel in the n-MOS channel region 22. The n-MOS gate electrode 21 is formed to face the n-MOS channel region 22 with the n-MOS gate oxide film 20 interposed between the n-MOS gate electrode 21 and the n-MOS channel region 22.

An n-type well region 23 is formed in the surface of the epitaxial layer 3 within the p-MOS region 16. A side surface of the n-type well region 23 is formed in the thickness direction of the epitaxial layer 3 from bottom surfaces of adjacent second element isolation insulating layers 62. A side surface of the n-type well region 23 (located at a side of the element isolation region 4) is formed to be in contact with the side surface of the p-type well region 17.

A $p^+$-type source region 24 and a $p^+$-type drain region 25 are formed selectively in an inner region of the n-type well region 23 to be spaced apart from each other. A p-MOS gate electrode 27 is formed on the surface of the epitaxial layer 3 within the p-MOS region 16 while a p-MOS gate oxide film 26 is interposed between the p-MOS gate electrode 27 and the epitaxial layer 3.

An impurity concentration of the n-type well region 23 may range, for example, from $1.0 \times 10^{15}$ cm$^{-3}$ to $1.0 \times 10^{17}$ cm$^{-3}$, and an impurity concentration of the $p^+$-type source region 24 and the $p^+$-type drain region 25 may range, for example, from $1.0 \times 10^{18}$ cm$^{-3}$ to $1.0 \times 10^{20}$ cm$^3$.

A region between the $p^+$-type source region 24 and the $p^+$-type drain region 25 corresponds to a p-MOS channel region 28 of the p-MOS region 16. The p-MOS gate electrode 27 controls forming a channel in the p-MOS channel region 28. The p-MOS gate electrode 27 is formed to face the p-MOS channel region 28 with the p-MOS gate oxide film 26 interposed between the p-MOS gate electrode 27 and the p-MOS channel region 28. The CMOS 14 is formed in the active region 5 in a manner as described above.

An interlayer insulating film 29 is then formed on the epitaxial layer 3 to cover the capacitor 8 and the CMOS 14.

A method of manufacturing the semiconductor device 1 will be described below with reference to FIGS. 2A to 2J. FIGS. 2A to 2J illustrate sectional views of manufacturing processes for the semiconductor device 1.

Figure 2A:
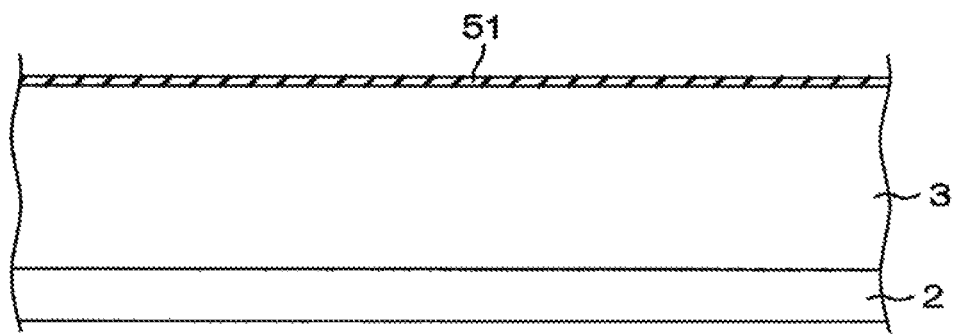
FIG. 2A illustrates a sectional view of a manufacturing process for the semiconductor device of FIG. 1.

For example, a silicon substrate as the $n^+$-type semiconductor substrate 2 is prepared for manufacturing the semiconductor device 1 as illustrated in FIG. 2A. Silicon is then epitaxially grown while n-type impurity ions are implanted so as to form the n-type epitaxial layer 3 on the semiconductor substrate 2. Subsequently, a pad oxide film 51 including $SiO_2$ as a main material is formed on the epitaxial layer 3, for example, by performing thermal oxidation.

Figure 2B:
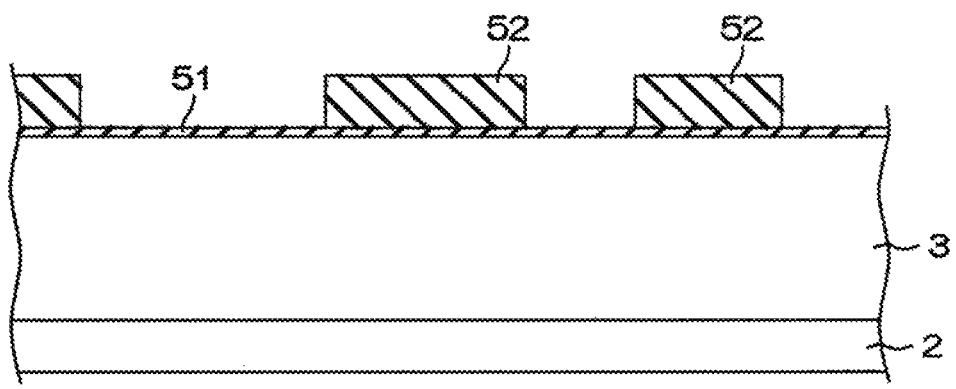
FIG. 2B illustrates a sectional view of a manufacturing process subsequent to FIG. 2A.

Next, as illustrated in FIG. 2B, a hard mask 52 having openings selectively in regions where the first element isolation insulating layer 61 and the second element isolation insulating layer 62 are to be formed is formed on the epitaxial layer 3 while the pad oxide film 51 is interposed between the hard mask 52 and the epitaxial layer 3.

Figure 2C:
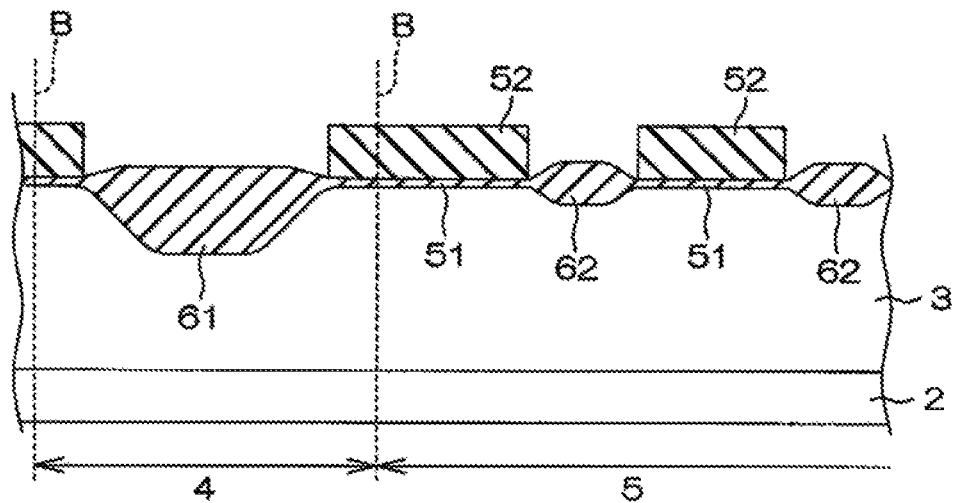
FIG. 2C illustrates a sectional view of a manufacturing process subsequent to FIG. 2B.

As illustrated in FIG. 2C, thermal oxidation is then performed on a surface of the epitaxial layer 3 through the hard mask 52. Thus, the first element isolation insulating layer 61 and the second element isolation insulating layer 62 are formed while they are connected integrally with the pad oxide film 51. The first element isolation insulating layer 61 and the second element isolation insulating layer 62 may be LOCOS oxide films including $SiO_2$ as a main material. Here, the boundary B may be set in any suitable position in a periphery of the first element isolation insulating layer 61. The hard mask 52 is removed after the first element isolation insulating layer 61 and the second element isolation insulating layer 62 are formed.

Figure 2D:
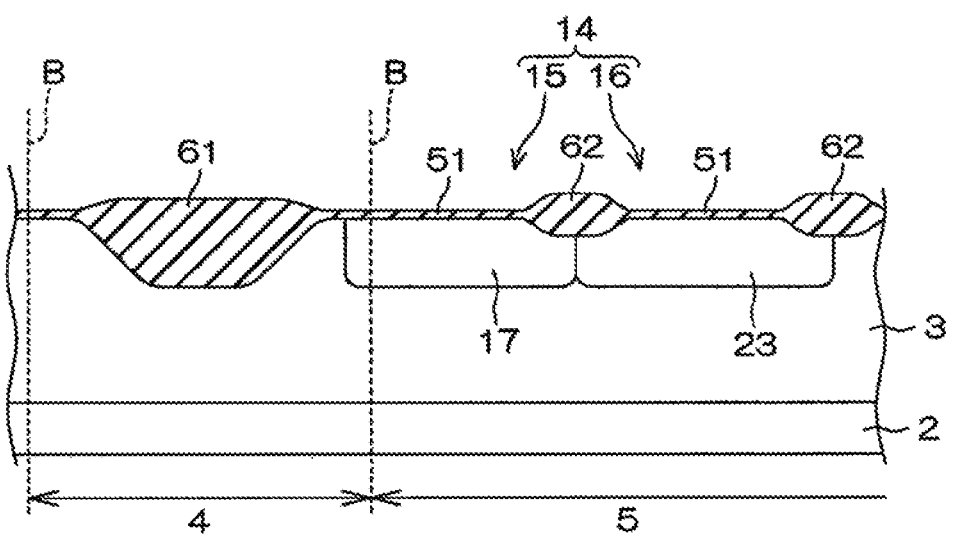
FIG. 2D illustrates a sectional view of a manufacturing process subsequent to FIG. 2C.

Subsequently, as illustrated in FIG. 2D, the p-type well region 17 of the n-MOS region 15 and the n-type well region 23 of the p-MOS region 16 are formed to be isolated from each other by the second element isolation insulating layer 62.

For example, in order to form the p-type well region 17 and the n-type well region 23, an ion implantation mask (not shown) having an opening selectively in a region where the p-type well region 17 is to be formed may be formed. In this case, the p-type well region 17 may be formed by implanting p-type impurities into the epitaxial layer 3 through the ion implantation mask (not shown). The ion implantation mask (not shown) is removed after the p-type well region 17 is formed.

Similarly, an ion implantation mask (not shown) having an opening selectively in a region where the n-type well region 23 is to be formed may be formed. The n-type well region 23 may then be formed by implanting n-type impurities into the epitaxial layer 3 through the ion implantation mask (not shown). The ion implantation mask (not shown) is removed after the n-type well region 23 is formed. In the manner as described above, the p-type well region 17 of the n-MOS region 15 and the n-type well region 23 of the p-MOS region 16 may be formed.

Figure 2E:
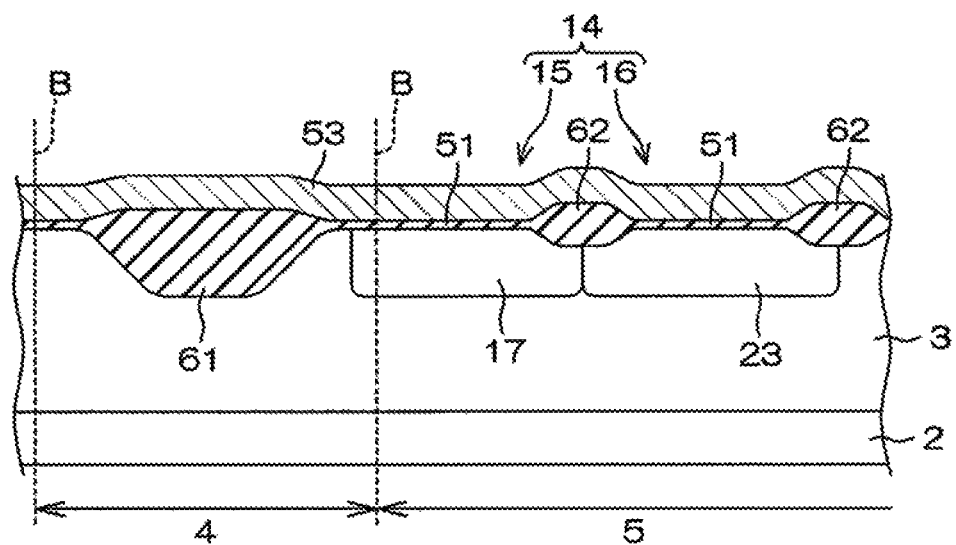
FIG. 2E illustrates a sectional view of a manufacturing process subsequent to FIG. 2D.

As illustrated in FIG. 2E, an electrode material layer 53 is then formed by depositing an electrode material for the lower electrode 9 on the epitaxial layer 3 to cover the first element isolation insulating layer 61 and the second element isolation insulating layer 62. For example, the electrode material layer 53 may be formed by CVD (Chemical Vapor Deposition). Subsequently, a hard mask (not shown) having an opening selectively in a region where the lower electrode 9 is to be formed is formed on the electrode material layer 53. Then, an unnecessary portion of the electrode material layer 53 is etched through the hard mask (not shown). Thus, the lower electrode 9 having the pair of end portions 10 is formed such that each of the end portions 10 is positioned to be spaced apart by a predetermined distance inward from a periphery of the first element isolation insulating layer 61 (i.e., the boundary B). The hard mask (not shown) is removed after the lower electrode 9 is formed.

Figure 2F:
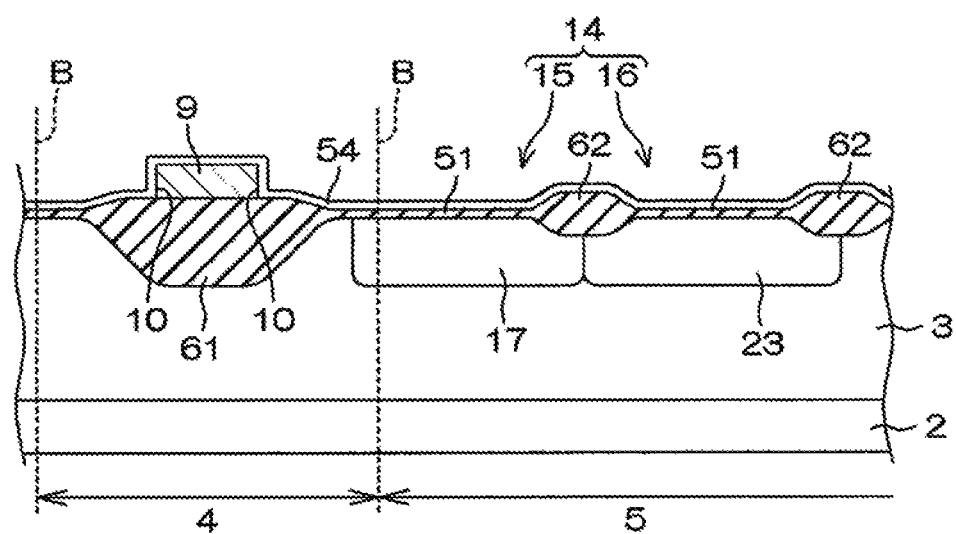
FIG. 2F illustrates a sectional view of a manufacturing process subsequent to FIG. 2E.

Next, an insulating material film 54 is formed by depositing an insulating material for the dielectric film 11 on the epitaxial layer 3 by CVD to cover the lower electrode 9, the first element isolation insulating layer 61, and the second element isolation insulating layer 62, as illustrated in FIG. 2F. The insulating material film 54 may be formed with an insulating material having an etching selectivity different from those of the first element isolation insulating layer 61 and the second element isolation insulating layer 62. Examples of the insulating material film 54 may include an $Si_3N_4$ film and an ONO film including a pair of $SiO_2$ films and an $Si_3N_4$ film interposed therebetween.

In the case of the ONO film, a first $SiO_2$ film may be deposited on the epitaxial layer 3 using CVD, and a $Si_3N_4$ film and a second $SiO_2$ film may then be deposited on the first $SiO_2$ film in that order using CVD, so as to form the ONO film.

Figure 2G:
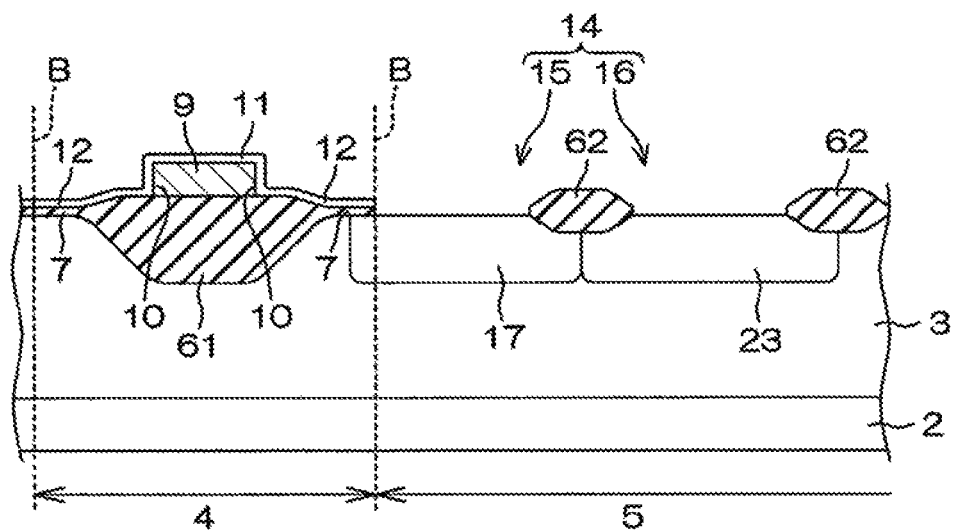
FIG. 2G illustrates a sectional view of a manufacturing process subsequent to FIG. 2F.

Next, as illustrated in FIG. 2G, a hard mask (not shown) having an opening to expose the active region 5 is selectively formed on the epitaxial layer 3 with the insulating material film 54 interposed between the hard mask and the epitaxial layer 3. Then, an unnecessary portion of the insulating material film 54 is etched through the hard mask (not shown). As a result, the dielectric film 11 covering the lower electrode 9, and the passivation film 12 connected integrally with the dielectric film 11 at the end portion 10 of the lower electrode 9 are formed on the first element isolation insulating layer 61. The hard mask (not shown) is removed after the dielectric film 11 and the passivation film 12 are formed.

Next, utilizing the dielectric film 11 and the passivation film 12 as an etching mask, the epitaxial layer 3 is wet-etched so as to remove a portion of the pad oxide film 51 that is formed in the active region 5. As a result, a portion of the pad oxide film 51 that is covered by the passivation film 12 remains as the raised portions 7 connected integrally with the first element isolation insulating layer 61.

In this case, HF (hydrofluoric acid) may be used as an etchant for the wet-etching. Among liquids which can etch the pad oxide film 51, HF has a relatively high etching rate for the pad oxide film 51, which may result in reduction of etching processing time and production costs.

Figure 2H:
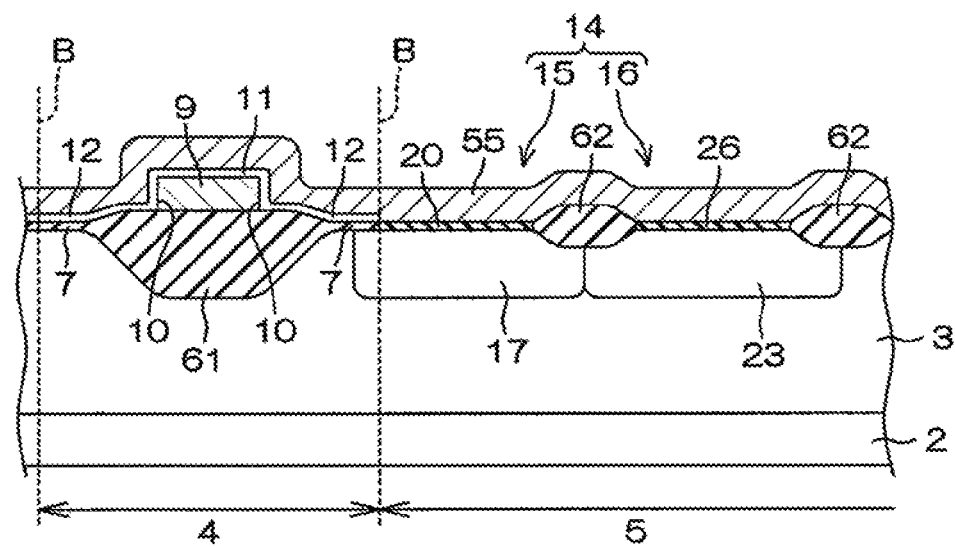
FIG. 2H illustrates a sectional view of a manufacturing process subsequent to FIG. 2G.
Figure 2I:
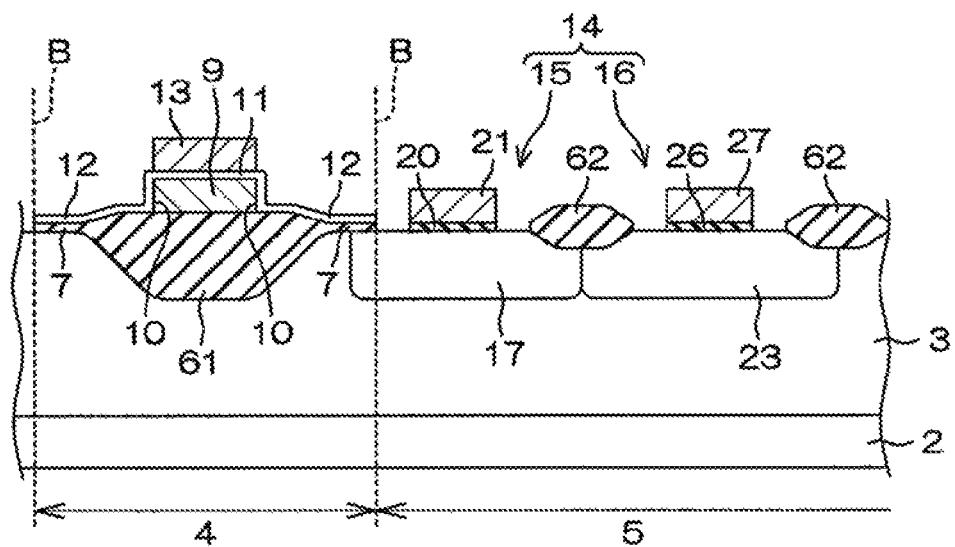
FIG. 2I illustrates a sectional view of a manufacturing process subsequent to FIG. 2H.

As illustrated in FIG. 2H, the n-MOS gate oxide film 20 and the p-MOS gate oxide film 26 are then formed in the active region 5 by subjecting the surface of the epitaxial layer 3 to thermal oxidation. Next, an electrode material layer 55 is formed by depositing an electrode material for the upper electrode 13, the n-MOS gate electrode 21, and the p-MOS gate electrode 27 to cover the epitaxial layer 3. Then, a hard mask (not shown) having openings selectively in regions where the electrodes 13, 21 and 27 are to be formed is formed on the electrode material layer 55. Unwanted portions of the electrode material layer 55 are etched through the hard mask (not shown) to form the electrodes 13, 21, and 27 as shown in FIG. 2I.

The etching process for the electrodes 13, 21, and 27 may be a dry etching process. In addition, after forming the electrodes 13, 21, and 27, a cleaning process using HF may be performed.

Figure 2J:
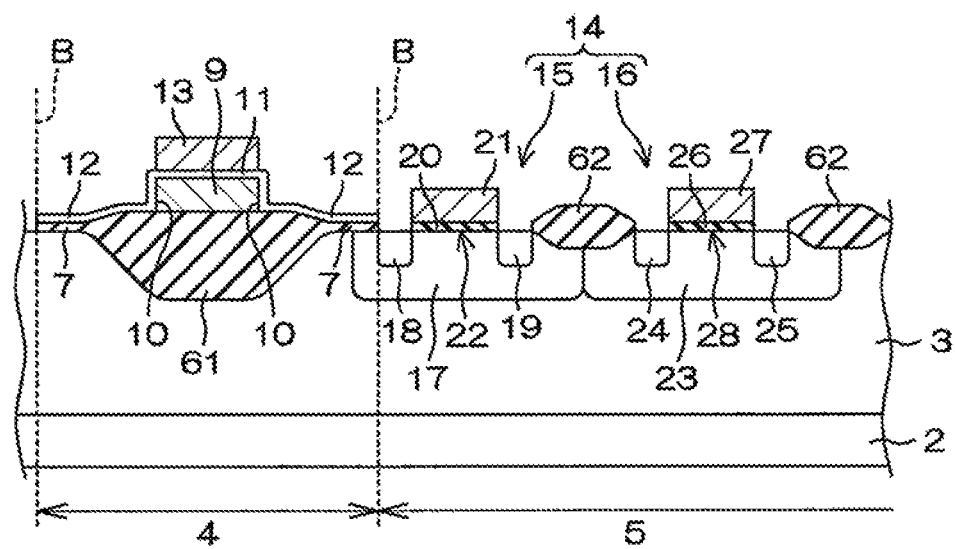
FIG. 2J illustrates a sectional view of a manufacturing process subsequent to FIG. 2I.

Subsequently, the $n^+$-type source region 18, the $n^+$-type drain region 19, the $p^+$-type source region 24, and the $p^+$-type drain region 25 are formed as illustrated in FIG. 2J.

In order to form the $n^+$-type source region 18 and the $n^+$-type drain region 19, for example, an ion implantation mask (not shown) having openings selectively in regions where the $n^+$-type source region 18 and the $n^+$-type drain region 19 are to be formed is formed. Then, n-type impurities are implanted into the epitaxial layer 3 through the ion implantation mask (not shown) to form the $n^+$-type source region 18 and the $n^+$-type drain region 19. The ion implantation mask (not shown) is removed after the $n^+$-type source region 18 and the $n^+$-type drain region 19 are formed.

Similarly, an ion implantation mask (not shown) having openings selectively in regions where the $p^+$-type source region 24 and the $p^+$-type drain region 25 are to be formed is formed. Then, p-type impurities are implanted into the epitaxial layer 3 through the ion implantation mask (not shown) to form the $p^+$-type source region 24 and the $p^+$-type drain region 25. The ion implantation mask (not shown) is removed after the $p^+$-type source region 24 and the $p^+$-type drain region 25 are formed. In the manner as described above, the $n^+$-type source region 18, the $n^+$-type drain region 19, the $p^+$-type source region 24, and the $p^+$-type drain region 25 are formed. Next, the epitaxial layer 3 is subjected to wet etching to remove undesired portions of the n-MOS gate oxide film 20 and the p-MOS gate oxide film 26 formed in the active region 5. In this case, HF may be used as an etchant for the wet etching in the same manner as described above, which may result in reduction of etching processing time and production costs.

As a result, the capacitor 8 and the CMOS 14 are formed. Then, the interlayer insulating film 29 is deposited on the epitaxial layer 3 to cover the capacitor 8 and the CMOS 14, thereby completing the semiconductor device 1 shown in FIG. 1.

As described above, according to the manufacturing method of the first embodiment of the present disclosure, the passivation film 12 having an etching selectivity different from that of the first element isolation insulating layer 61 is formed in the region from the end portion of the lower electrode 9 to the boundary B. Accordingly, when the pad oxide film 51, the n-MOS gate oxide film 20, and the p-MOS gate oxide film 26 include the same material as the first element isolation insulating layer 61 are wet-etched (see FIGS. 2G and 2J) and when the cleaning process is performed after forming the upper electrode 13, the n-MOS gate electrode 21, and the p-MOS gate electrode 27 (see FIG. 2I), the passivation film 12 can prevent the first element isolation insulating layer 61 from being exposed to the etchant.

In addition, since the passivation film 12 is formed to be connected, at the end portion 10 of the lower electrode 9, integrally with the dielectric film 11 which is formed to cover the lower electrode 9, the first element isolation insulating layer 61 disposed directly below the end portion 10 of the lower electrode 9, in which cavities might be easily formed due to side-etching, can be prevented from being side-etched.

Specifically, when side-etching occurs in the first element isolation insulating layer 61 in conventional methods, cavities whose boundaries are defined by the end portion 10 of the lower electrode 9 and the first element isolation insulating layer 61 may be formed in the region directly below the end portion 10 of the lower electrode 9. When cavities are formed, the electrode material of the upper electrode 13 that is introduced in the cavities may become etching residue, which generates undesirable particles.

In contrast, since the passivation film 12 is extended beginning from the end portion 10 of the lower electrode 9, according to various embodiments, side-etching of the first element isolation insulating layer 61 that is disposed directly below the end portion 10 of the lower electrode 9 can be prevented.

Further, since the end portion of the passivation film 12 is extended to reach the boundary B, the entire surface of the first element isolation insulating layer 61 can be prevented from being side-etched. As a result, it is possible to provide a semiconductor device having high reliability.

Furthermore, since side-etching is prevented, a vertical position of the surface of the first element isolation insulating layer 61 does not go down. Accordingly, a step (i.e., height difference) between the surface of the first element isolation insulating layer 61 and an upper surface of the dielectric film 11 can be reduced, and thus, a step between portions of the electrode material layer 55 for the upper electrode 13 on the dielectric film 11 (i.e., a portion to become the upper electrode 13) and on the first element isolation insulating layer 61 (i.e., a portion to be removed) can be reduced in the process of FIG. 2H. Accordingly, it is possible to shorten etching time required to remove any unnecessary portions of the electrode material layer 55 for forming the upper electrode 13.

In addition, according to this method, the lower electrode 9 can be protected from a short-circuit since the surface of the lower electrode 9 is covered by the dielectric film 11. A capacitance of the capacitor 8 can also be increased since the upper electrode 13 can be formed to face the entire upper surface of the lower electrode 9.

Next, a semiconductor device 31 according to a second embodiment of the present disclosure will be described with reference to FIG. 3.

Figure 3:
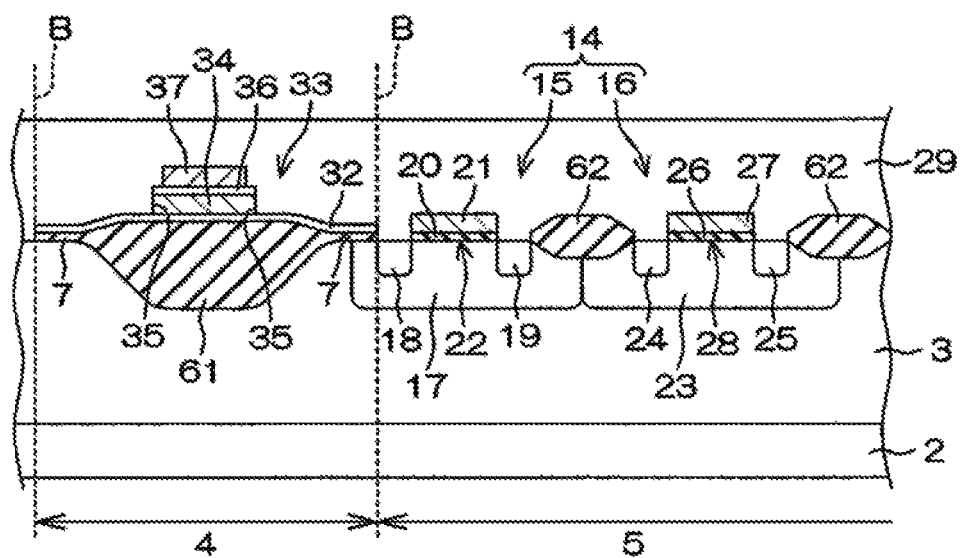
FIG. 3 schematically illustrates a sectional view of a semiconductor device according to a second embodiment of the present disclosure.

FIG. 3 illustrates a sectional view of the semiconductor device 31 according to the second embodiment of the present disclosure. The semiconductor device 31 has the same configuration as the semiconductor device 1 according to the first embodiment except that a capacitor 33 is formed on the first element isolation insulating layer 61 with a passivation film 32 interposed between the capacitor 33 and the first element isolation insulating layer 61. The elements in FIG. 3 that are the same as those in FIGS. 1 and 2A to 2J are denoted by the same reference numerals and explanation for those elements will be omitted.

In the semiconductor device 31, the capacitor 33 is formed on the first element isolation insulating layer 61 with the passivation film 32 interposed between the capacitor 33 and the first element isolation insulating layer 61. The passivation film 32 is formed to cover the first element isolation insulating layer 61.

An end portion of the passivation film 32 is formed to extend to the boundary B that separates the element isolation region 4 and the active region 5. A sectional surface of the end portion in the passivation film 32 is formed to be substantially flush with the sectional surface of the raised portion 7 in the first element isolation insulating layer 61. The passivation film 32 may include an $Si_3N_4$-containing insulating material. A thickness of the passivation film 32 may range, for example, from 0.01 μm to 0.05 μm.

The capacitor 33 includes a lower electrode 34 having a pair of end portions 35 at opposite sides of the lower electrode 34. Each of the end portions 10 is positioned to be spaced apart by a predetermined distance inward from a periphery of the first element isolation insulating layer 61 (i.e., the boundary B). The capacitor 33 also includes a dielectric film 36 formed on the lower electrode 34, and an upper electrode 37 formed on the dielectric film 36 to face the lower electrode 34 with the dielectric film 36 interposed between the upper electrode 37 and the lower electrode 34. For example, the lower electrode 34 may include a polysilicon-containing electrode material.

The dielectric film 36 is formed to cover an entire upper surface of the lower electrode 34 while exposing side surfaces of the lower electrode 34. A thickness of the dielectric film 36 may range, for example, from 0.01 μm to 0.05 μm. For example, the dielectric film 36 may include an $Si_3N_4$ film or an ONO film including a pair of $SiO_2$ films and an $Si_3N_4$ film interposed therebetween.

In this embodiment, an end portion of the upper electrode 37 retracts inward from the side surface of the lower electrode 34 such that a side surface of the upper electrode 37 is positioned inward from the side surface of the lower electrode 34. For example, the upper electrode 37 may include a polysilicon or tungsten silicon-containing electrode material. In the manner as described above, the capacitor 33 is formed on the first element isolation insulating layer 61 while the passivation film 32 is interposed between the capacitor 33 and the first element isolation insulating layer 61.

In one embodiment, the upper electrode 37 may be formed such that the side surface of the lower electrode 34 is flush with the side surface of the upper electrode 37 in the same or similar manner as described in the first embodiment. In another embodiment, the end portion of the upper electrode 37 may extend outward from the side surface of the lower electrode 34.

As an example of a semiconductor element, the CMOS 14 is formed in the active region 5 in the same or similar manner as described in the first embodiment. Since the CMOS 14 includes the same or similar configurations as those in the first embodiment, a description for such same or similar configurations for the CMOS 14 will be omitted.

A method of manufacturing the semiconductor device 31 will be described below with reference to FIGS. 4A to 4K.

FIGS. 4A to 4K illustrate sectional views of manufacturing processes for the semiconductor device 31 of FIG. 3.

Figure 4A:
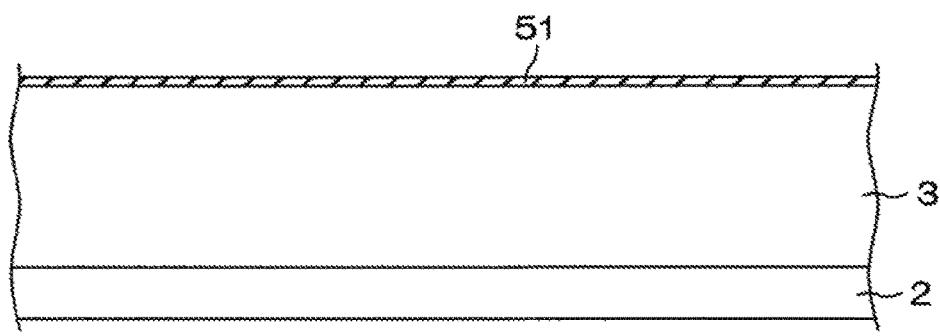
FIG. 4A illustrates a sectional view of a manufacturing process for the semiconductor device of FIG. 3.

In the same or similar manner as described in the first embodiment, for manufacturing the semiconductor device 31, the $n^-$-type epitaxial layer 3 is formed on the $n^+$-type semiconductor substrate 2, and the pad oxide film 51 including $SiO_2$ as a main materials is formed on the epitaxial layer 3, for example, by performing thermal oxidation, as illustrated in FIG. 4A.

Figure 4B:
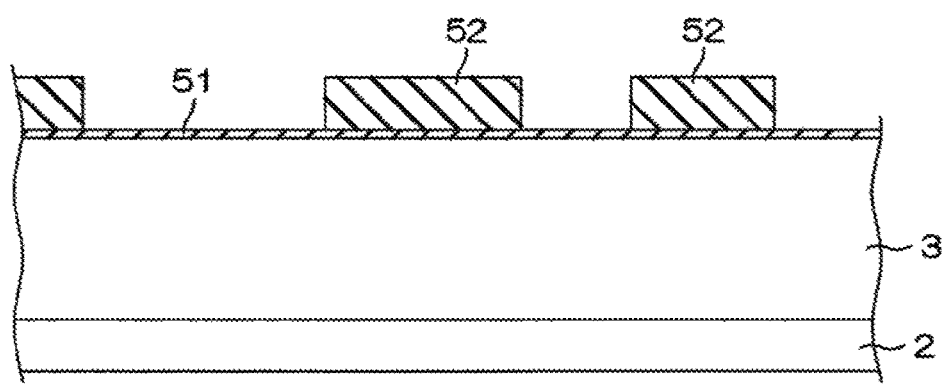
FIG. 4B illustrates a sectional view of a manufacturing process subsequent to FIG. 4A.

Next, as illustrated in FIG. 4B, the hard mask 52 having openings selectively in regions where the first element isolation insulating layer 61 and the second element isolation insulating layer 62 are to be formed is formed on the epitaxial layer 3 while the pad oxide film 51 is interposed between the hard mask 52 and the epitaxial layer 3.

Figure 4C:
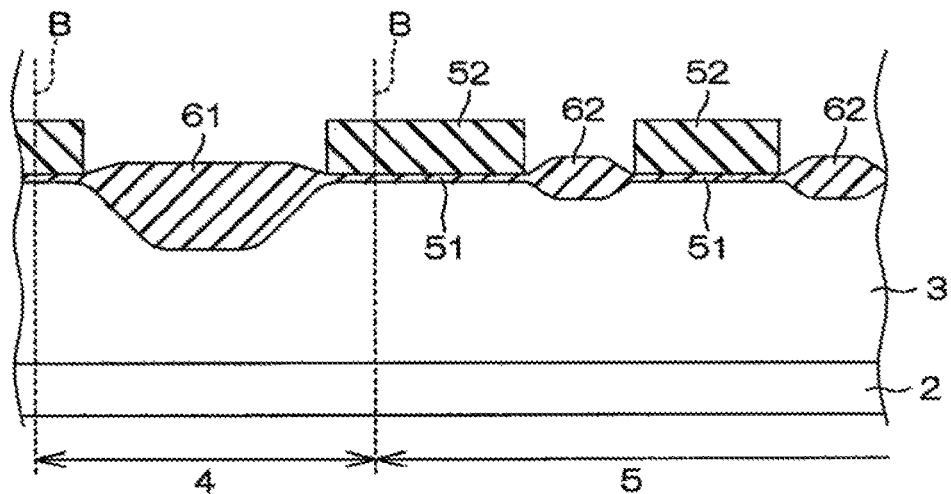
FIG. 4C illustrates a sectional view of a manufacturing process subsequent to FIG. 4B.

As illustrated in FIG. 4C, thermal oxidation is then performed on a surface of the epitaxial layer 3 through the hard mask 52. Thus, the first element isolation insulating layer 61 and the second element isolation insulating layer 62 are formed while they are connected integrally with the pad oxide film 51. The first element isolation insulating layer 61 and the second element isolation insulating layer 62 may be LOCOS oxide films including $SiO_2$ as a main material. Here, the boundary B may be set in any suitable position in a periphery of the first element isolation insulating layer 61. The hard mask 52 is removed after the first element isolation insulating layer 61 and the second element isolation insulating layer 62 are formed.

Figure 4D:
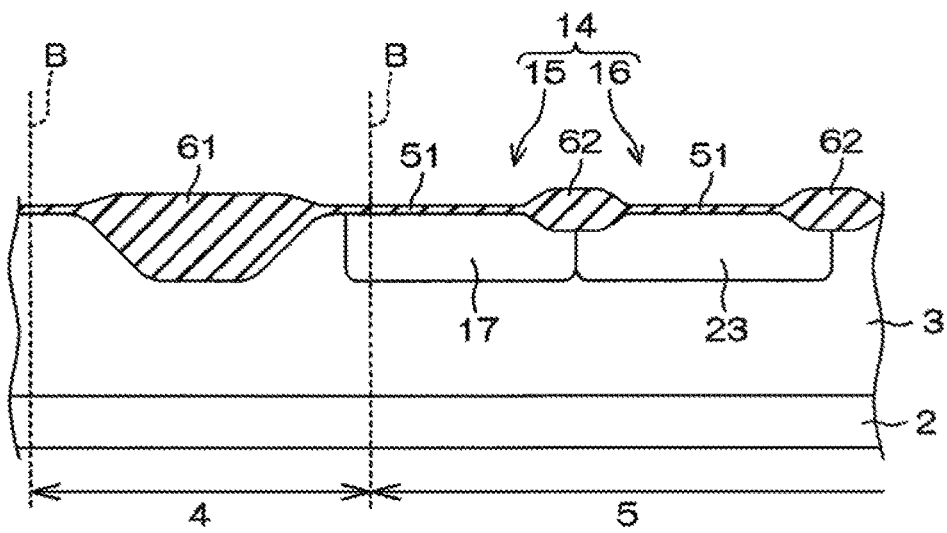
FIG. 4D illustrates a sectional view of a manufacturing process subsequent to FIG. 4C.

Subsequently, as illustrated in FIG. 4D, the p-type well region 17 of the n-MOS region 15 and the n-type well region 23 of the p-MOS region 16 are formed to be isolated from each other by the second element isolation insulating layer 62.

For example, in order to form the p-type well region 17 and the n-type well region 23, an ion implantation mask (not shown) having an opening selectively in a region where the p-type well region 17 is to be formed may be formed. In this case, the p-type well region 17 may be formed by implanting p-type impurities into the epitaxial layer 3 through the ion implantation mask (not shown). The ion implantation mask (not shown) is removed after the p-type well region 17 is formed.

Similarly, an ion implantation mask (not shown) having an opening selectively in a region where the n-type well region 23 is to be formed may be formed. The n-type well region 23 may then be formed by implanting n-type impurities into the epitaxial layer 3 through the ion implantation mask (not shown). The ion implantation mask (not shown) is removed after the n-type well region 23 is formed. In the manner as described above, the p-type well region 17 of the n-MOS region 15 and the n-type well region 23 of the p-MOS region 16 are formed.

Figure 4E:
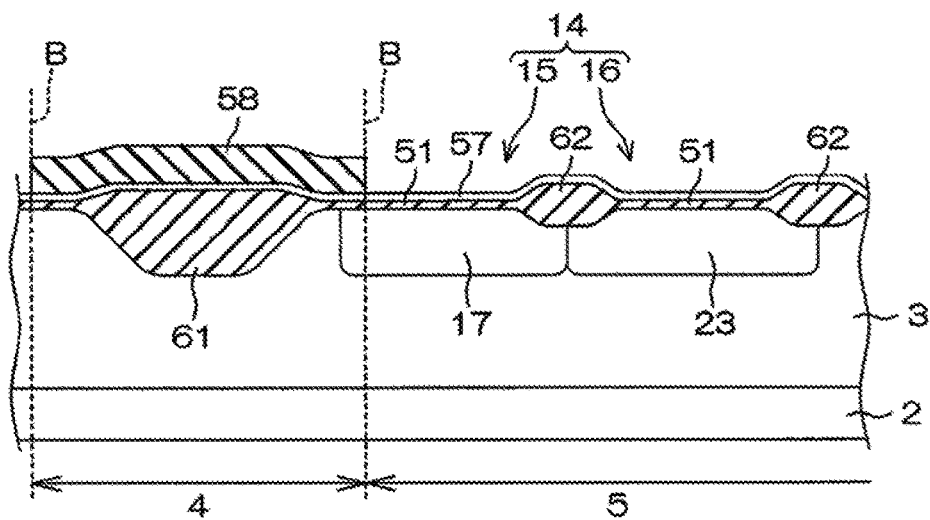
FIG. 4E illustrates a sectional view of a manufacturing process subsequent to FIG. 4D.

Subsequently, in order to cover the first element isolation insulating layer 61 and the second element isolation insulating layer 62, an insulating material film 57 is formed by depositing an insulating material for a passivation film 32 on the epitaxial layer 3, for example, by CVD, as illustrated in FIG. 4E. A hard mask 58 is then selectively formed to cover the first element isolation insulating layer 61 while the insulating material film 57 is interposed between the hard mask 58 and the first element isolation insulating layer 61.

Figure 4F:
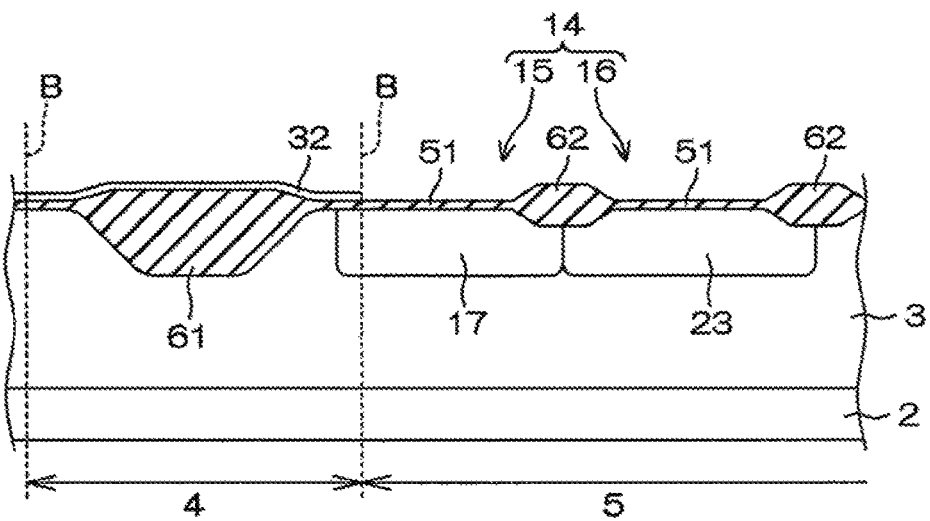
FIG. 4F illustrates a sectional view of a manufacturing process subsequent to FIG. 4E.

As illustrated in FIG. 4F, the passivation film 32 that covers the first element isolation insulating layer 61 is formed by etching the insulating material film 57 through the hard mask 58 to remove an unnecessary portion of the insulating material film 57. The hard mask 58 is removed after the passivation film 32 is formed.

Figure 4G:
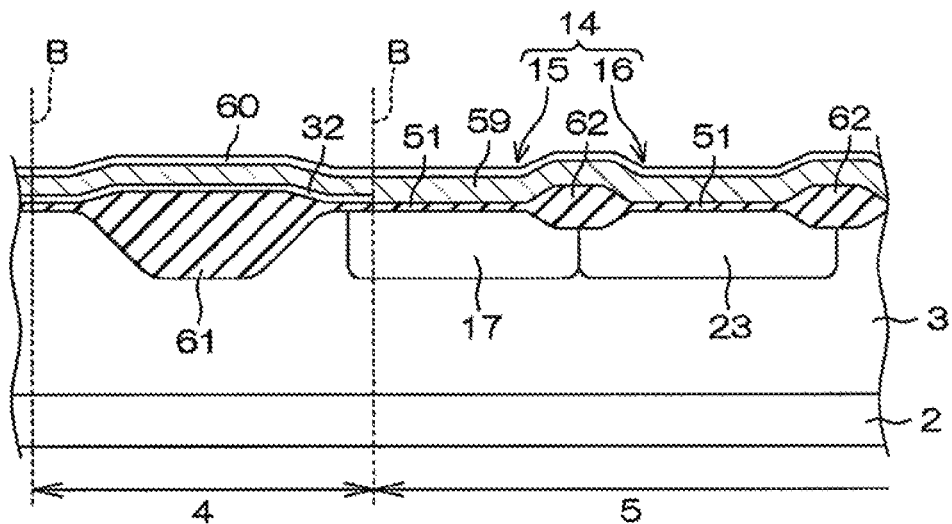
FIG. 4G illustrates a sectional view of a manufacturing process subsequent to FIG. 4F.

As illustrated in FIG. 4G, an electrode material layer 59 is formed by depositing an electrode material for the lower electrode 34 on the epitaxial layer 3 using CVD. Similarly, an insulating material film 60 is formed by depositing an insulating material for the dielectric film 36 using CVD to cover the electrode material layer 59. An example of the insulating material film 60 may include an $Si_3N_4$ film or an ONO film (Oxide-Nitride-Oxide film) including a pair of $SiO_2$ films and an $Si_3N_4$ film interposed therebetween.

In the case of the ONO film, a first $SiO_2$ film may be deposited on the epitaxial layer 3 using CVD, and a $Si_3N_4$ film and a second $SiO_2$ film may then be deposited on the first $SiO_2$ film in that order using CVD, so as to form the ONO film.

Subsequently, a hard mask (not shown) having an opening selectively in a region where the lower electrode 34 and the dielectric film 36 are to be formed is formed on the insulating material film 60. The insulating material film 60 and the electrode material layer 59 are then subjected to an etching process through the hard mask (not shown). Thus, the lower electrode 34 having the pair of end portions 35 is formed such that each of the end portions 35 is positioned to be spaced apart by a predetermined distance inward from a periphery of the first element isolation insulating layer 61 (i.e., the boundary B), and the dielectric film 36 is formed to cover the entire upper surface of the lower electrode 34. The hard mask (not shown) is removed after the lower electrode 34 and the dielectric film 36 are formed.

Figure 4H:
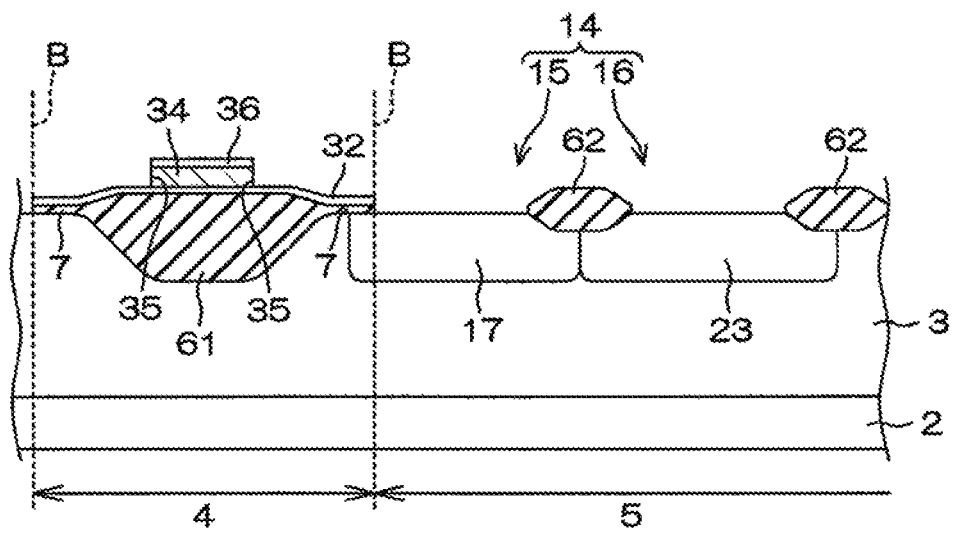
FIG. 4H illustrates a sectional view of a manufacturing process subsequent to FIG. 4G.

Next, utilizing the passivation film 32 as an etching mask, the epitaxial layer 3 is wet-etched so as to remove the pad oxide film 51 formed in the active region 5, as illustrated in FIG. 4H. As a result, portions of the pad oxide film 51 covered by the passivation film 32 remains as raised portions 7 connected integrally with the first element isolation insulating layer 61.

Figure 4I:
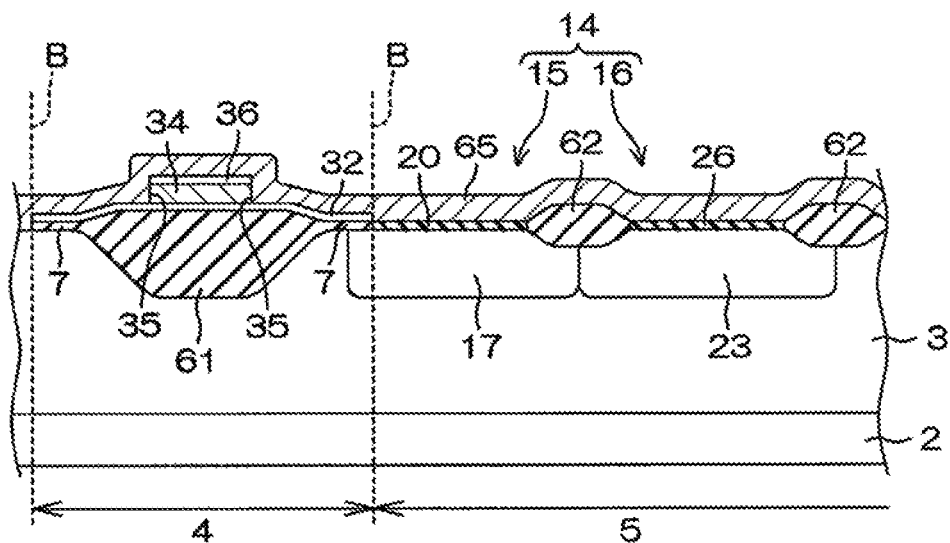
FIG. 4I illustrates a sectional view of a manufacturing process subsequent to FIG. 4H.

Subsequently, the surface of the epitaxial layer 3 is exposed to thermal oxidation to form the n-MOS gate oxide film 20 and the p-MOS gate oxide film 26 in the active region 5 as illustrated in FIG. 4I.

Figure 4J:
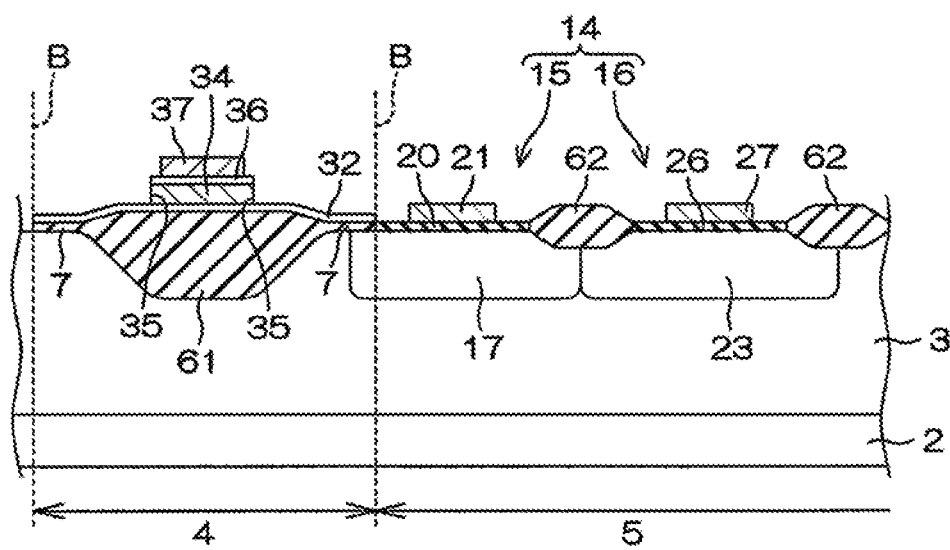
FIG. 4J illustrates a sectional view of a manufacturing process subsequent to FIG. 4I.

Next, an electrode material layer 65 is formed by depositing an electrode material for the upper electrode 37, the n-MOS gate electrode 21, and the p-MOS gate electrode 27 to cover the epitaxial layer 3. A hard mask (not shown) having openings selectively in regions where the electrodes 37, 21, and 27 are to be formed is then formed on the electrode material layer 65. Subsequently, unwanted portions of the electrode material layer 65 are etched through the hard mask (not shown) to form the electrodes 37, 21, and 27 as illustrated in FIG. 4J.

The etching process for the electrodes 37, 21, and 27 may be a dry etching process. In addition, after forming the electrodes 37, 21 and 27, a cleaning process using HF is performed.

Figure 4K:
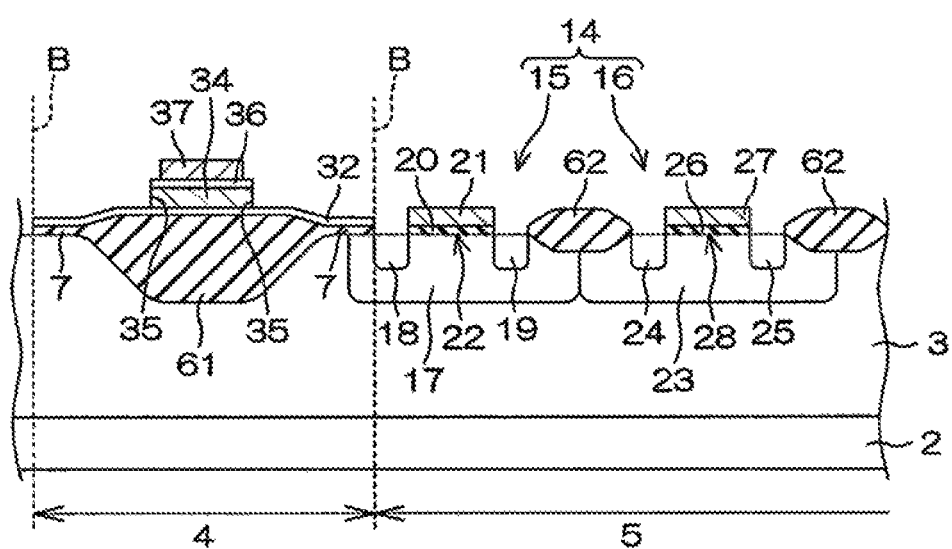
FIG. 4K illustrates a sectional view of a manufacturing process subsequent to FIG. 4J.

Next, as illustrated in FIG. 4K, the $n^+$-type source region 18, the $n^+$-type drain region 19, the $p^+$-type source region 24, and a $p^+$-type drain region 25 are formed.

In order to form the $n^+$-type source region 18 and the $n^+$-type drain region 19, for example, an ion implantation mask (not shown) having openings selectively in regions where the $n^+$-type source region 18 and the $n^+$-type drain region 19 are to be formed is formed. Then, n-type impurities are implanted into the epitaxial layer 3 through the ion implantation mask (not shown) to form the $n^+$-type source region 18 and the $n^+$-type drain region 19. The ion implantation mask (not shown) is removed after the $n^+$-type source region 18 and the $n^+$-type drain region 19 are formed.

Similarly, an ion implantation mask (not shown) having openings selectively in regions where the $p^+$-type source region 24 and the $p^+$-type drain region 25 are to be formed is formed. Then, p-type impurities are implanted into the epitaxial layer 3 through the ion implantation mask (not shown) to form the $p^+$-type source region 24 and the $p^+$-type drain region 25. The ion implantation mask (not shown) is removed after the $p^+$-type source region 24 and the $p^+$-type drain region 25 are formed. In the manner as described above, the $n^+$-type source region 18, the $n^+$-type drain region 19, the $p^+$-type source region 24, and the $p^+$-type drain region 25 are formed.

Next, the epitaxial layer 3 is subjected to wet etching to remove undesired portions of the n-MOS gate oxide film 20 and the p-MOS gate oxide film 26 formed in the active region 5. In this case, HF may be used as an etchant for wet etching in the same manner as described above, which may result in reduction of etching processing time and production costs.

As a result, the capacitor 33 and the CMOS 14 are formed. Then, the interlayer insulating film 29 is deposited on the epitaxial layer 3 to cover the capacitor 33 and the CMOS 14, thereby completing the semiconductor device 31 shown in FIG. 3.

As described above, according to the manufacturing method of the second embodiment of the present disclosure, the passivation film 32 is formed in an early phase to cover the surface of the first element isolation insulating layer 61. As such, side-etching in a region directly below the end portion 35 of the lower electrode 34 can be prevented by forming the passivation film 32 to cover the entire surface of the first element isolation insulating layer 61 in an early phase.

In addition, since the passivation film 32 which extends across the end portions 35 of the lower electrode 34 is formed along the surface of the first element isolation insulating layer 61, a step coverage (i.e., coating effect) of the end portions 35 of the lower electrode 34 can be improved. Accordingly, the passivation film 32 can be formed to be relatively thick near the end portions 35 of the lower electrode 34, which may result in further improvement of the effect of reducing the side-etching.

A semiconductor device 41 according to a third embodiment of the present disclosure will be described below with reference to FIG. 5.

Figure 5:
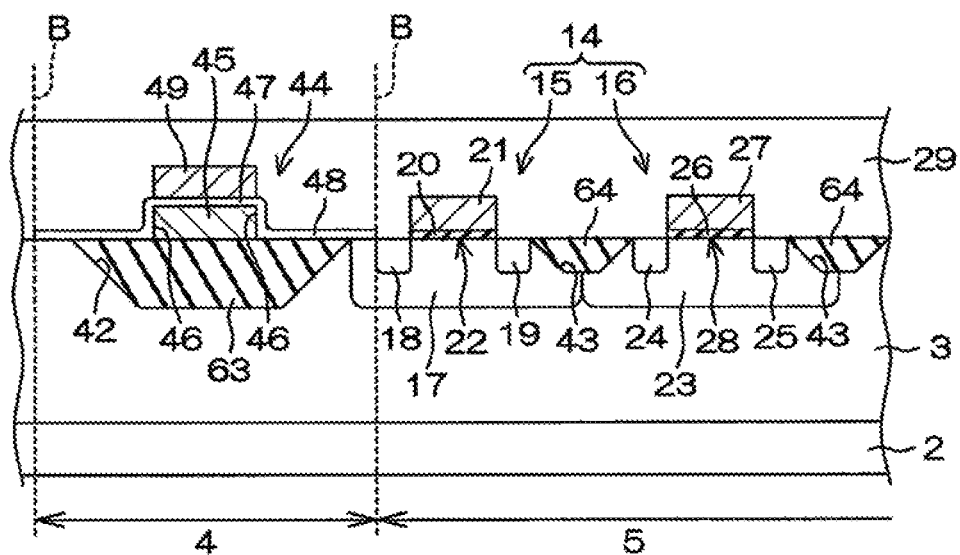
FIG. 5 schematically illustrates a sectional view of a semiconductor device according to a third embodiment of the present disclosure.

FIG. 5 illustrates a sectional view of the semiconductor device 41 according to the third embodiment of the present disclosure. The semiconductor device 41 has the same configuration as the semiconductor device 1 according to the first embodiment except that the semiconductor device 41 is configured to include a trench insulating material instead of the LOCOS oxide film in the semiconductor device 1. The elements in FIG. 5 which are the same as those in FIGS. 1 to 4K are denoted by the same reference numerals and explanation for those elements will be omitted.

In the semiconductor device 41, a first element isolation insulating layer 63 that partitions the element isolation region 4 and the active region 5 is selectively formed on the surface of the epitaxial layer 3.

The first element isolation insulating layer 63 includes a trench 42 which is formed by selectively eroding down the surface of the epitaxial layer 3 in the thickness direction, and an insulating material which fills the trench 42. The trench 42 is formed in a tapered shape such that an opening of the tapered shape becomes gradually narrow in the thickness direction from the surface of the epitaxial layer 3 when viewed from top. An example of the insulating material filling the trench 42 may include $SiO_2$.

For example, the first element isolation insulating layer 63 formed as described above may be implemented with STI (Shallow Trench Isolation) which is formed by burying a shallow trench insulating material in the trench 42. A capacitor 44 is formed on the first element isolation insulating layer 63.

The capacitor 44 includes a lower electrode 45 having a pair of end portions 46 at opposite sides of the lower electrode 45. Each of the end portions 46 is positioned to be spaced apart by a predetermined distance inward from a periphery of the first element isolation insulating layer 63 (i.e., the boundary B). The capacitor 44 also includes a dielectric film 47 formed on the lower electrode 45, a passivation film 48 formed to cover a region between the end portion 46 of the lower electrode 45 and the boundary B, and an upper electrode 49 formed on the dielectric film 47 to face the lower electrode 45 with the dielectric film 47 interposed between the upper electrode 49 and the lower electrode 45.

The passivation film 48 is formed to be connected integrally with the dielectric film 47 at the end portion 46 of the lower electrode 45 in the same or similar manner as described in the first embodiment. The passivation film 48 has the same thickness as the dielectric film 47 and includes the same material as the dielectric film 47. Further, the passivation film 48 is formed to start from the end portion 46 of the lower electrode 45 and extend midway between the lower electrode 45 and the first element isolation insulating layer 63. In this case, an end portion of the passivation film 48 is formed to reach the boundary B between the first element isolation insulating layer 63 and the active region 5.

As an example of a semiconductor element, the CMOS 14 is formed in the active region 5, as in the first and second embodiments. In the third embodiment, the CMOS 14 includes the n-MOS region 15 of an n-type and the p-MOS region 16 of a p-type, which are isolated from each other by a second element isolation insulating layer 64.

The second element isolation insulating layer 64 includes a trench 43 which is formed by selectively eroding down the surface of the epitaxial layer 3 in the thickness direction, and an insulating material which fills the trench 43. The second element isolation insulating layer 64 is formed to be smaller than the first element isolation insulating layer 63. The trench 43 is formed in a tapered shape such that an opening of the tapered shape becomes gradually narrow in the thickness direction from the surface of the epitaxial layer 3 when viewed from top. An example of the insulating material filling the trench 43 may include $SiO_2$.

For example, the second element isolation insulating layer 64 formed as described above may be implemented with STI which is formed by burying a shallow trench insulating material in the trench 43.

Other configurations are the same as those in the first and second embodiments and explanation for such configuration will be omitted.

As described above, the semiconductor device 41 according to the third embodiment of the present disclosure can achieve the same effects as the first and second embodiments. Although the particular embodiments of the present disclosure are illustrated as above, the present disclosure may be practiced in different manners.

For example, although the first and second embodiments describe that the end portions of the passivation films 12 and 32 are formed to be substantially flush with the sectional surface of the raised portions 7, the passivation films 12 and 32 may have the end portions at a position spaced apart by a predetermined distance inward from the boundary B or at a position spaced by a predetermined distance outward from the boundary B.

In this case, the end portions of the passivation films 12 and 32 may be formed to overlap the raised portions 7 across the boundary B. Accordingly, since the passivation films 12 and 32 can completely cover the first element isolation insulating layer 61 and the raised portions 7, side-etching can be prevented in all regions where the first element isolation insulating layer 61 and the raised portions 7 are formed.

In addition, although the passivation film 32 is not formed to be connected integrally with the dielectric film as in the second embodiment, in contrast to the first embodiment, the passivation film 32 may be formed to be connected integrally with the dielectric film 36 at the end portion 35 of the lower electrode 34 as in the first embodiment. In this case, the passivation film 32 may include the same material as the dielectric film 36 and have the same thickness as the dielectric film 36.

Further, although the raised portions 7 connected integrally with the first element isolation insulating layer 63 are not formed in the periphery of the first element isolation insulating layer 63 in the third embodiment, the raised portions 7 may be formed to overlap the surface of the epitaxial layer 3 as described in the first embodiment.

Furthermore, although the third embodiment describes that the capacitor 44 is formed on the first element isolation insulating layer 63, the capacitor 44 may be formed on the first element isolation insulating layer 63 while the passivation film 48 is interposed between the capacitor 44 and the first element isolation insulating layer 63, as described in the second embodiment. In this case, the passivation film 48 may be connected integrally with the dielectric film 47 at the end portion 46 of the lower electrode 45 as described in the first embodiment.

In addition, although the first to third embodiments describe that the CMOS 14 is formed in the active region 5, the present disclosure is not limited thereto. For example, the CMOS 14 may be replaced with a BJT (Bipolar Junction Transistor), an IGBT (Insulated Gate Bipolar Transistor), a JFET (Junction Field Effect Transistor), a non-volatile memory having a control gate and a floating gate, and the like.

In addition, a plurality of semiconductor elements may be selected from the above semiconductor elements and formed on the epitaxial layer 3. Various circuit elements such as capacitors, registers, and the like may also be formed on the epitaxial layer 3. Further, combinations of these semiconductor elements and circuit elements may constitute an integrated circuit such as a LSI (Large Scale Integration), SSI (Small Scale Integration), MSI (Medium Scale Integration), VLSI (Very Large Scale Integration), ULSI (Ultra-Very Large Scale Integration), and the like.

In addition, although the first to third embodiments describe that any of the capacitors 8, 33, and 44 is disposed on any of the first element isolation insulating layers 61 and 63, the present disclosure may be applied to a configuration where any of the capacitors 8, 33, and 44 is disposed on an insulating layer other than any element isolation insulating layer formed on the epitaxial layer 3. In addition, although the first to third embodiments illustrate the n-type semiconductor substrate 2, the n-type semiconductor substrate 2 may be replaced with a p-type semiconductor substrate 2 having an inverted conductivity type. In this case, the conductivity type of other impurity regions is inverted.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor device comprising:
   an insulating layer formed selectively on a semiconductor layer to isolate an active region in the semiconductor layer;
   a lower electrode, formed on the insulating layer, having an end portion at a position spaced apart by a predetermined distance inward from a periphery of the insulating layer;
   a dielectric film formed on the lower electrode;
   an upper electrode, formed on the dielectric film, facing the lower electrode with the dielectric film interposed between the upper electrode and the lower electrode; and
   a passivation film, interposed between the insulating layer and the lower electrode, the passivation film including an insulating material having an etching selectivity with respect to the insulating layer,
   wherein an end portion of the passivation film is flush with the periphery of the insulating layer on a boundary between the insulating layer and the active region.

2. The semiconductor device of claim 1, wherein the passivation film is formed to start from the end portion of the lower electrode and extend toward the active region.

3. The semiconductor device of claim 1, wherein the upper electrode is formed to face an entire upper surface of the lower electrode.

4. The semiconductor device of claim 1, wherein the insulating layer includes an $SiO_2$ layer and the passivation film includes an $Si_3N_4$ film or an ONO film.

5. The semiconductor device of claim 1, wherein the insulating layer includes a LOCOS oxide film.

6. The semiconductor device of claim 1, wherein the insulating layer includes an insulating film buried in a shallow trench formed in the semiconductor layer.

7. The semiconductor device of claim 1, wherein the passivation film includes the same material as the dielectric film.

8. The semiconductor device of claim 1, wherein the passivation film has the same thickness as the dielectric film.

9. The semiconductor device of claim 1, wherein a thickness of the dielectric film ranges from 0.01 mm to 0.05 mm.

10. The semiconductor device of claim 1, wherein a side surface of the upper electrode is positioned inward from a side surface of the lower electrode.

11. The semiconductor device of claim 1, wherein the passivation film is formed along a surface of the insulating layer and extends across the lower electrode so as to interpose the passivation film between the surface of the insulating layer and the lower electrode.

12. The semiconductor device of claim 1, wherein a thickness of the passivation film is larger in a portion near the end portion of the lower electrode than in a remaining portion.

13. The semiconductor device of claim 1, wherein the active region includes a transistor region, and
   wherein the transistor region includes:
   a well region formed across from the active region and the insulating layer; and
   a gate electrode formed in an upper portion of the transistor region and having a thickness that is the same as that of the upper electrode.

* * * * *